(12) United States Patent
Gao et al.

(10) Patent No.: US 8,913,639 B2
(45) Date of Patent: Dec. 16, 2014

(54) LASER SAFETY TECHNIQUES AND CONFIGURATIONS

(75) Inventors: Miaobin Gao, Saratoga, CA (US); Hui-Chin Wu, Cupertino, CA (US); Christine M. Krause, Santa Cruz, CA (US); Hengju Cheng, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,981

(22) PCT Filed: Mar. 27, 2012

(86) PCT No.: PCT/US2012/030760
§ 371 (c)(1),
(2), (4) Date: Jun. 25, 2013

(87) PCT Pub. No.: WO2013/147753
PCT Pub. Date: Oct. 3, 2013

(65) Prior Publication Data
US 2014/0186046 A1     Jul. 3, 2014

(51) Int. Cl.
*H01S 3/00* (2006.01)
*H04B 10/2575* (2013.01)
*H01S 5/042* (2006.01)
*H01S 5/068* (2006.01)
*H01S 3/10* (2006.01)

(52) U.S. Cl.
CPC ........ *H01S 3/0014* (2013.01); *H04B 10/25752* (2013.01); *H01S 5/0427* (2013.01); *H01S 5/06825* (2013.01); *H01S 3/10* (2013.01)

USPC .................. 372/38.09; 372/38.07; 372/38.02

(58) Field of Classification Search
USPC ................................ 372/38.09, 38.07, 38.02
See application file for complete search history.

(56) References Cited

U.S. PATENT DOCUMENTS

| 7,742,514 | B1 * | 6/2010 | Sanders | .................... 372/38.02 |
| 2005/0135811 | A1 | 6/2005 | Lee et al. | |
| 2006/0034027 | A1 * | 2/2006 | Moyer et al. | ................. 361/93.1 |
| 2007/0230525 | A1 * | 10/2007 | Sanders et al. | ............. 372/38.02 |
| 2007/0280313 | A1 | 12/2007 | Hsieh et al. | |

OTHER PUBLICATIONS

International Search Report and Written Opinion for PCT/US2012/030760, mailed Nov. 23, 2012, 13 pages.
International Preliminary Report on Patentability for PCT Application No. PCT/US2012/030760 dated Oct. 9, 2014, 10 pages.

* cited by examiner

*Primary Examiner* — Kinam Park
(74) *Attorney, Agent, or Firm* — Schwabe Williamson & Wyatt PC

(57) ABSTRACT

Embodiments of the present disclosure provide laser safety techniques and configurations. In one embodiment, an optical module includes a first die including a laser configured to transmit optical signals, a first node electrically coupled with the laser, and a second node electrically coupled with the laser, and a second die including a power supply line configured to provide power to the laser, a third node electrically coupled with the power supply line and electrically coupled with the first node to provide the power to the laser, a fourth node electrically coupled with the second node of the first die, and a switch configured to prevent the power of the power supply line from reaching the laser through the third node based on a voltage of the fourth node when a laser fault event occurs. Other embodiments may be described and/or claimed.

25 Claims, 4 Drawing Sheets

LASER SAFETY TECHNIQUES AND CONFIGURATIONS

CROSS REFERENCE TO RELATED APPLICATION

The present application is a national phase entry under 35 U.S.C. §371 of International Application No. PCT/US2012/030760, filed Mar. 27, 2012, entitled "LASER SAFETY TECHNIQUES AND CONFIGURATIONS," which designates, among the various States, the United States of America, and the entire contents and disclosures of which are hereby incorporated by reference in their entireties.

FIELD

Embodiments of the present disclosure generally relate to the field of integrated circuits, and more particularly, to laser safety techniques and configurations.

BACKGROUND

A single fault eye safety event may occur when a bonding wire breaks for a laser node. For example, a bonding wire that couples a laser of a laser die to a power supply voltage of another die may break and be shorted to ground (e.g., by touching the laser die surface), which may cause a voltage over the laser to be too large with no current constraint. The laser may, as a result, be over-driven, and the optical output power of the laser may exceed an eye safety limit for laser safety class certification such as, for example, Class 1 certification as internationally specified by the International Electrotechnical Commission (IEC) 60825.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide laser safety techniques and configurations. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
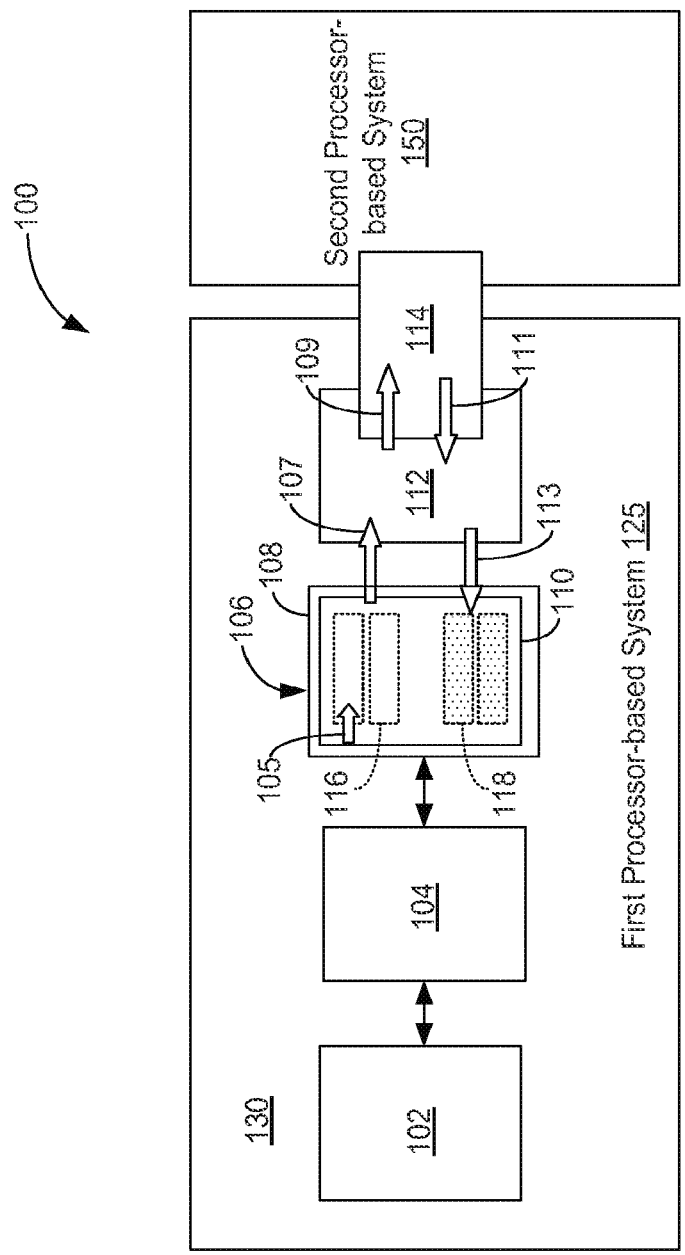
FIG. 1 schematically illustrates a top view of an example optical communication system, in accordance with some embodiments.

FIG. 1 schematically illustrates a top view of an example optical communication system 100, in accordance with some embodiments. The optical communication system may include a first processor-based system 125 and a second processor-based system 150 optically coupled together using an optical coupler 114 such as, for example, fiber(s) and/or waveguide(s) to route light in the form of "optical mode" signals, hereinafter "optical signals" (e.g., light 109, 111), between the first processor-based system 125 and the second processor-based system 150. In some embodiments, the optical coupler 114 may be an optical cable.

The first processor-based system 125 may include one or more processors (hereinafter processor 102) mounted on a substrate 130 such as, for example, a circuit board. The processor 102 may be operatively coupled with an optical module 106 to communicate with the second processor-based system 150 using optical signals (e.g., light 105, 107, 109) generated by the optical module 106 based on electrical signals received from the processor 102. For example, in some embodiments, the processor 102 may be operatively coupled with the optical module 106 via a switch and/or router device (hereinafter switch/router 104).

The switch/router 104 may be configured to receive electrical signals from the processor 102 (or other devices that may be mounted on the substrate 130) and route the electrical signals to the optical module 106 for conversion to optical signals and transmission to the second processor-based system 150. The electrical signals received by the optical module 106 may include, for example, electrical input/output (I/O) signals from the processor 102. In some embodiments, the switch/router 104 may include a multiport switch and/or functionality to support star, tree, or daisy chain network topologies. The switch/router 104 may further be configured to send information in accordance with multiple protocols over a same physical (PHY) layer to the optical module. In some embodiments, the switch/router 104 may multiplex the multiple protocols together in a physical (PHY) layer frame. The switch/router 104 may communicate with the optical module 106 using encapsulated or native protocols. In some embodiments, the switch/router 104 may include software drivers for the encapsulated or native protocols. The switch/router 104 may further be configured to provide packet formation with Quality of Service (QoS) and/or provide time synchronization, which may include, low latency and accurate synchronization to support professional audio or video applications.

The optical module 106 may be configured to receive the electrical signals from the switch/router 104 and convert the electrical signals into corresponding optical signals (e.g., light 105, 107, 109) for transmission of the optical signals to another device configured to receive the optical signals (e.g., second processor-based system 150). The optical module 106 may be further configured to receive and convert optical signals (e.g., light 111, 113) received over the optical coupler 114 from the second processor-based system 150 into electrical signals for routing to the processor 102.

In some embodiments, the optical module 106 may include an opto-electronic assembly such as, for example, a first die 108 mounted on the substrate 130 and a second die 110 communicatively coupled with the first die 108. The first die 108 may represent, for example, a photonic die comprising a planar lightwave circuit (PLC) and/or a transceiver (Tx/Rx) die configured with optical components such as one or more laser drivers (e.g., laser driver 116) and one or more receivers (e.g., receiver 118) corresponding with one or more channels of an optical link. The laser driver 116 may include circuitry to support a laser safety mechanism in accordance with embodiments described in connection with configurations 200 or 300 of respective FIG. 2 or 3. The laser safety mechanism may be configured to perform actions described in connection with FIG. 4. The first die 108 may further include modulators, splitters, gratings, and the like (not shown). The second die 110 may be a light-source die, which may be referred to as a "laser die" in some embodiments, and may include a light source such as one or more lasers to generate light (e.g., light 105, 107, 109) for optical signaling. The one or more lasers may comport with embodiments described in connection with lasers 220 or 320 of respective FIG. 2 or 3. The second die 110 may include any type of chip suitable for producing optical signals.

The second die 110 may be electrically coupled with the first die 108 in a variety of suitable configurations. In some embodiments, the first die 108 and the second die 110 may be mounted on the substrate 130 and electrically coupled together using bonding wires (e.g., as depicted in the configuration 200 or 300 of FIG. 2 or 3). In some embodiments, the second die 110 may be mounted on the first die 108 (e.g., in a flip-chip configuration) using one or more bump interconnect structures. The laser driver 116 and the receiver 118 are depicted in dashed form to indicate that they are disposed under the second die 110 in the illustrated embodiment. Although the first die 108 is depicted as larger than the second die 110 in FIG. 1 for the sake of clarity, the dies 108, 110 may have different relative sizes in other embodiments. In some embodiments, the die (e.g., the second die 110) that includes the light source (e.g., lasers) is optically coupled with connector element 112 and/or the optical coupler 114. The connector element 112 may be mounted on the die having the light source. In other embodiments, the optical module 106 may be embodied in the optical coupler 114 (e.g., as part of an active optical cable).

The optical module 106 may include opto-electronic assemblies having other configurations in other embodiments. For example, components of the optical module 106 may be mounted on the substrate 130 in some embodiments. In other embodiments, components of the optical module 106 may be mounted on the processor 102 or components of the optical module 106 may be formed as part of the processor 102. In some embodiments, the switch/router 104 and the optical module 106 may be embodied in separate dies that are mounted on the substrate 130. In some embodiments, the switch/router 104 may be embodied in a same die as the processor 102.

In some embodiments, the processor 102 may be configured to control one or more laser drivers (e.g., laser driver 116) of the optical module 106 to generate optical signals using light from the light-source die. The light 107 may be output from the optical module 106 to the connector element 112. The connector element 112 may include, for example, an optical plug or other coupler that further routes the light 109 from the optical module 106 over the optical coupler 114 to the second processor-based system 150.

In some embodiments, the second processor-based system 150 is configured to send light 111 over the optical coupler 114 to the first processor-based system 125. Although not shown, the second processor-based system 150 may be similarly equipped as the first processor-based system 125 or otherwise comport with embodiments described in connection the first processor-based system 125. The light 111 sent by the second processor-based system 150 may be received by the connector element 112 of the first processor-based system 125. The connector element 112 may route the light 113 to one or more receivers (e.g., receiver 118) of the optical module 106. The optical module 106 may be configured to generate electrical signals based on the light 113 received at the receiver 118 and route the electrical signals to the processor 102 (e.g., via the switch/router 104). The processor 102 may be configured to process the electrical signals received from the optical module 106.

The first processor-based system 125 and/or the second processor-based system 150 may include additional components in some embodiments. For example, the first processor-based system 125 and/or the second processor-based system 150 may comport with embodiments described in connection with the example processor-based system 500 of FIG. 5. In other embodiments, laser safety techniques and configurations described herein can be used in other systems that benefit from the principles described herein. Such systems may include, for example, optical cables, optical links, optical sensors, network hubs, routers, optical backplanes, intra-chip optical links and the like.

Figure 2:
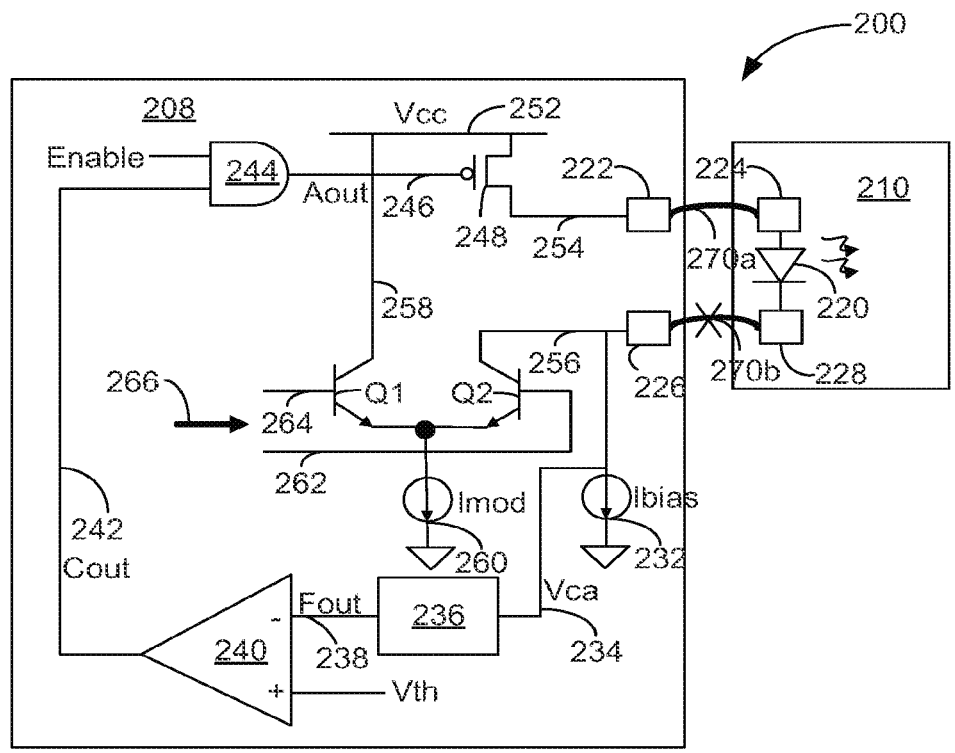
FIG. 2 schematically illustrates an example configuration of a common anode laser driver having a laser safety mechanism, in accordance with some embodiments.

FIG. 2 schematically illustrates an example configuration 200 of a common anode laser driver having a laser safety mechanism, in accordance with some embodiments. In some embodiments, the configuration 200 includes a first die 208 electrically coupled with a second die 210. The first die 208 and the second die 210 may comport with embodiments described in connection the first die 108 and the second die 110 of FIG. 1. According to various embodiments, the first die 208 includes circuitry of a laser driver and a laser safety mechanism and the second die 210 includes a light-emitting device such as a laser 220.

The circuitry of the laser driver may include, for example, a laser driver power supply line (e.g., Vcc) hereinafter ("power supply line 252") configured to provide power for the laser 220. The power supply line 252 may be coupled with a node such as, for example, a laser driver anode 222 and another node such as, for example, laser driver cathode 226, as can be seen. In some embodiments, the laser driver anode 222 and the laser driver cathode 226 may be disposed on the first die 208 and a corresponding laser anode 224 and laser cathode 228 may be disposed on the second die 210. The laser driver anode 222 may be electrically coupled with the corresponding laser anode 224 and the laser driver cathode 226 may be electrically coupled with the corresponding laser cathode 228 disposed on the second die 210 to provide power to the laser 220. The laser driver anode 222 and the laser driver cathode 226 may be coupled with the respective laser anode 224 and laser cathode 228 using an interconnect structure such as, for example, bonding wires 270a, 270b, as can be seen.

The circuitry of the laser driver may further include a first transistor Q1 and a second transistor Q2 configured as a differential pair to receive electrical signals (e.g., data signals 266) for optical transmission by the laser 220. The first transistor Q1 and the second transistor Q2 may, for example, be configured to receive the electrical signals via lines 262 and 264. The first transistor Q1 may be coupled with the power supply line 252 via line 258 and the second transistor Q2 may be coupled with the laser driver cathode 226 via line 256. The circuitry of the laser driver may further include a current source such as, for example, a laser modulation (Imod) current source 260 coupled with the first transistor Q1 and the second transistor Q2, as can be seen. The power supply line 252 may be coupled with the laser driver anode 222 via line 254.

The circuitry of the laser safety mechanism may be coupled with the circuitry of the laser driver to prevent power of the power supply line 252 from reaching the laser 220 when a laser fault event occurs. The circuitry of the laser safety mechanism may include a current source such as, for example, a laser bias (Ibias) current source 232 coupled with the laser driver cathode 226, as can be seen. Line 234 may be configured to sense a voltage (e.g., Vca) of the laser driver cathode 226. A filter such as, for example, a low-pass filter 236 may be coupled to line 234 to output a signal (e.g., Fout) on line 238 as an input to comparator 240 based on the voltage of line 234. The low-pass filter 236 may filter out a high frequency component of the line 234 and only allow DC to pass to the input of the comparator 240. The comparator 240 may be configured to output a signal (e.g., Gout) on line 242 based on the signal received on line 238. A gate such as, for example, an AND gate (hereinafter "gate 244") may be configured to output a signal (e.g., Aout) on line 246 based on the signal received on line 242. For example, the gate 244 may be configured to enable the eye safety mechanism (e.g., switch off power from the power supply line 252) when Enable is equal to '1.' A switch 248 may be configured between the power supply line 252 and the laser driver anode 222 to prevent power of the power supply line 252 from reaching the laser driver anode 222 (and, thus, the laser 220) based on the signal received on line 246.

In some embodiments, the power supply line 252 may be configured to provide from 3.1 volts (V) to 3.4 V to the laser anode 224 via the laser driver anode 222. The laser driver cathode 226 may be configured to provide from 1.1 V to 1.3 V to the laser cathode 228 to provide a 2 V to 2.2 V potential for the laser 220, in some embodiments. Thus, during normal operation, a voltage of the laser driver cathode 226 may have a value of about 1.2 V. The comparator 240 may be configured to monitor the voltage (e.g., Fout from the low-pass filter 236) of the laser driver cathode 226 and compare the voltage with a pre-configured threshold voltage (Vth). For example, the pre-configured threshold voltage may have a value of 0.6 V in some embodiments. When the voltage of the laser driver cathode 226 (e.g., 1.2 V) is greater than the threshold voltage (e.g., 0.6 V), then the comparator 240 may send a signal (e.g., 0 V) to the gate 244 that causes the gate 244 to leave the switch 248 "on" to allow power to reach the laser driver anode 222 from the power supply line 252. The voltages described in connection with the configuration 200 are only examples and other suitable voltages can be used in other embodiments.

The circuitry of the laser safety mechanism may be configured to turn the switch 248 "off" to prevent power from reaching the laser driver anode 222 from the power supply line 252 when a laser fault event occurs. The laser fault event may include, for example, a single fault eye safety event, which may occur when there is an electrical disconnection between the laser driver cathode 226 and the laser cathode 228 (e.g., the bonding wire 270b between the laser driver cathode 226 and the laser cathode 228 breaks or otherwise fails). In some embodiments, the laser fault event occurs when the bonding wire 270b is electrically disconnected from the laser driver cathode 226. Subsequent to breaking, for example, the bonding wire 270b may come into physical contact with a ground voltage (e.g., a surface of the second die 210) and may result in over-driving the laser (e.g., 3.3 V) and create a laser eye safety issue unless the laser 220 is powered down.

In some embodiments, the Ibias current source 232 may be configured to set or pull the voltage of the laser driver cathode 226 to a pre-configured fault event value in response to the fault event (e.g., breaking of the bonding wire 270b). In some embodiments, the Ibias current source 232 may pull the line 234 to ground. In some embodiments, the pre-configured fault event value may be a ground voltage or other voltage that is less than the threshold voltage Vth. Thus, the voltage of the laser driver cathode 226 sensed by the comparator 240 (e.g., Fout of line 238 output by low-pass filter 236) may be less than the pre-configured threshold voltage Vth, triggering the power down of the laser 220. The comparator 240 may be configured to output a signal (e.g., Cout) based on the comparison of Fout with Vth that causes the gate 244 to enable the switch 248 to prevent the power of the power supply line 252 from reaching the laser 220 through the laser driver anode 222. In some embodiments, the switch 248 is a P-type device such as, for example, a P-type metal-on-semiconductor (PMOS) switch. In some embodiments, when Fout is less than the Vth, the comparator 240 outputs Cout at Vcc voltage and the gate 244 outputs Aout at Vcc voltage. In some embodiments, the laser safety mechanism is configured to automatically power down the laser 220 within 1 millisecond (ms) of the laser fault event.

Figure 3:
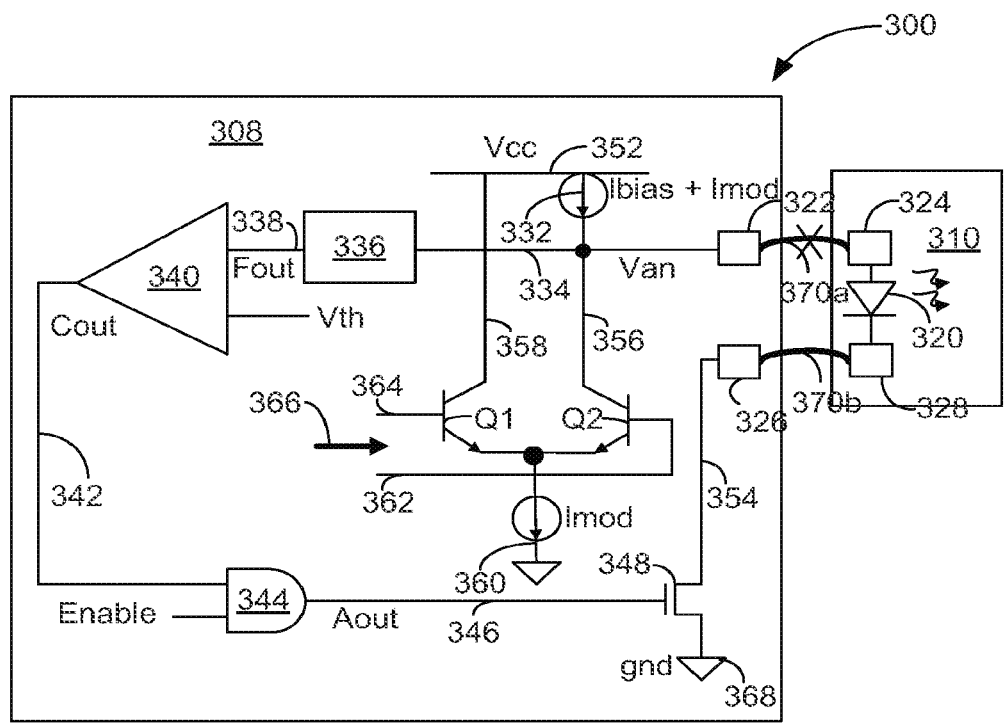
FIG. 3 schematically illustrates an example configuration of a common cathode laser driver having a laser safety mechanism, in accordance with some embodiments.

FIG. 3 schematically illustrates an example configuration 300 of a common cathode laser driver having a laser safety mechanism, in accordance with some embodiments. In some embodiments, the configuration 300 includes a first die 308 electrically coupled with a second die 310. The first die 308 and the second die 310 may comport with embodiments described in connection the first die 108 and the second die 110 of FIG. 1. According to various embodiments, the first die 308 includes circuitry of a laser driver and a laser safety mechanism and a second die 310 includes a light-emitting device such as a laser 320. In some embodiments, features of configuration 300 may operate in accordance with analogous features described in connection with configuration 200.

In configuration 300, the circuitry of the laser driver may include, for example, a laser driver power supply line 352 (e.g., Vcc) configured to provide power for the laser 320. The laser power supply line 352 may be coupled with a node such as, for example, a laser driver anode 322 and another node such as, for example, laser driver cathode 326, as can be seen. In some embodiments, the laser driver anode 322 and the laser driver cathode 326 may be disposed on the first die 308 and a corresponding laser anode 324 and laser cathode 328 may be disposed on the second die 310. The laser driver anode 322 may be electrically coupled with the corresponding laser anode 324 and the laser driver cathode 326 may be electrically coupled with the corresponding laser cathode 328 disposed on the second die 310 to provide power to the laser 320. The laser driver anode 322 and the laser driver cathode 326 may be coupled with the respective laser anode 324 and laser cathode 328 using an interconnect structure such as, for example, bonding wires 370a, 370b, as can be seen.

The circuitry of the laser driver may further include a first transistor Q1 and a second transistor Q2 configured as a differential pair to receive electrical signals (e.g., data signals 366) for optical transmission by the laser 320. The first transistor Q1 and the second transistor Q2 may, for example, be configured to receive the electrical signals via lines 362 and 364. The first transistor Q1 may be coupled with the power supply line 352 via line 358 and the second transistor Q2 may be coupled with the laser driver anode 322 via line 356. The circuitry of the laser driver may further include a current source such as, for example, a laser modulation (Imod) current source 360 coupled with the first transistor Q1 and the second transistor Q2, as can be seen. The power supply line 352 may be coupled with the laser driver anode 322 via line 334.

The circuitry of the laser safety mechanism may be coupled with the circuitry of the laser driver to prevent power of the power supply line 352 from reaching the laser 320 when a laser fault event occurs. The circuitry of the laser safety mechanism may include a current source such as, for example, a laser bias (Ibias) and/or laser modulation (Imod) current source (e.g., hereinafter "Ibias+Imod" current source 332) that is coupled with the laser driver anode 322, as can be seen. Line 334 may be configured to sense a voltage (e.g., Van) of the laser driver anode 322. A filter such as, for example, a low-pass filter 336 may be coupled to line 334 to output a signal (e.g., Fout) on line 338 as an input to comparator 340 based on the voltage of line 334. The comparator 340 may be configured to output a signal (e.g., Gout) on line 342 based on the signal received on line 338. A gate such as, for example, an AND gate (hereinafter "gate 344") may be configured to output a signal (e.g., Aout) on line 346 based on the signal received on line 342. For example, the gate 344 may be configured to enable the eye safety mechanism (e.g., switch off power from the power supply line 352) when Enable is equal to '1.' A switch 348 may be configured between a ground source 368 and the laser driver cathode 326, as can be seen. The switch 348 may be configured to set the laser driver cathode 326 to a ground voltage by coupling the laser driver cathode 326 to the ground source 368 based on the signal received on line 346 (e.g., in response to a laser fault event).

In some embodiments, during normal operation (e.g., when a laser fault event has not occurred), the laser driver cathode 326 may be configured to provide a ground voltage (e.g., of ground source 368) to the laser cathode 328. The laser driver anode 322 may be configured to provide from 2.0 V to 2.2 V to the laser anode 324, in some embodiments. The comparator 340 may be configured to monitor the voltage (e.g., Fout from the low-pass filter 336) of the laser driver anode 322 and compare the voltage with a pre-configured threshold voltage (Vth). For example, the pre-configured threshold voltage may have a value between the Vcc voltage and the Van voltage such as, for example, from 2.6 V to 2.8 V, in some embodiments. When the voltage (e.g., 2.1 V) of the laser driver anode 322 is less than the threshold voltage (e.g., 2.7 V), then the comparator 340 may send a signal (e.g., 0 V) to the gate 344 that causes the gate 344 to leave the switch 348 "on" to allow ground voltage to reach the laser driver cathode 326 from the ground source 368. The voltages described in connection with the configuration 300 are only examples and other suitable voltages can be used in other embodiments.

The circuitry of the laser safety mechanism may be configured to turn the switch 348 "off" to prevent ground voltage from reaching the laser driver cathode 326 from the ground source 368 when a laser fault event occurs. The laser fault event may include, for example, a single fault eye safety event, which may occur when there is an electrical disconnection between the laser driver anode 322 and the laser anode 324 (e.g., the bonding wire 370a between the laser driver anode 322 and the laser anode 324 breaks or otherwise fails). In some embodiments, the laser fault event occurs when the bonding wire 370a is electrically disconnected from the laser driver anode 322. Subsequent to breaking, for example, the bonding wire 370a may come into physical contact with a power supply voltage (e.g., a surface of the second die 310 having Vcc voltage) and may result in overdriving the laser and create a laser eye safety issue unless the laser 320 is powered down.

In some embodiments, the Ibias+Imod current source 332 may be configured to set or pull the voltage of the laser driver anode 322 to a pre-configured fault event value in response to the fault event (e.g., breaking of the bonding wire 370a). In some embodiments, the Ibias+Imod current source 332 may pull the line 334 (e.g., Van) to a power supply voltage (e.g., 3.3 V). In some embodiments, the pre-configured fault event value may be a power supply voltage (e.g., Vcc) or other voltage that is greater than the threshold voltage Vth. Thus, the voltage of the laser driver anode 322 sensed by the comparator 340 (e.g., Fout of line 338 output by low-pass filter 336) may be greater than the pre-configured threshold voltage Vth, triggering the power down of the laser 320. The comparator 340 may be configured to output a signal (e.g., Gout) based on the comparison of Fout with Vth that causes the gate 344 to enable the switch 348 to turn off and prevent the laser driver cathode 326 from electrical access to the ground source 368 and, thus, prevent power from reaching the laser 320. For example, turning off the switch 348 may prevent current from flowing from Vcc (e.g., from the bonding wire 370a in contact with a surface of the second die 310) to the laser 320 to the bonding wire 370b and to the ground source 368. In some embodiments, the switch 348 is an N-type device such as, for example, an N-type metal-on-semiconductor (NMOS) switch. In some embodiments, when Fout is greater than the Vth, the comparator 340 outputs Gout at ground voltage and the gate 344 outputs Aout at ground voltage. In some embodiments, the laser safety mechanism is configured to automatically power down the laser 320 within 1 millisecond (ms) of the laser fault event.

In some embodiments, the configuration 200 of FIG. 2 and the configuration 300 of FIG. 3 may provide Class 1 laser eye safety certification as internationally specified by the International Electrotechnical Commission (IEC) 60825 and may reduce system complexity relative to other laser safety mechanisms. For example, a laser safety mechanism may be based on a current sensing scheme such as, for example, a switch controller coupled with an external current sensing resistor and comparator. When a fault occurs in such a current sensing scheme, the switch controller may sense an output of the comparator and send a laser shut down command to the optical module through a 2-wire serial interface. Such current sensing solution, however, may increase component cost (e.g., external components) and complexity of the system relative to voltage sensing configurations (e.g., 200 and 300)

described herein. Additionally, the present configurations (e.g., 200 and 300) may involve fewer headroom concerns relative to current sensing solutions that include a sensing resistor in the laser current path by providing greater voltage headroom in the current source.

Figure 4:
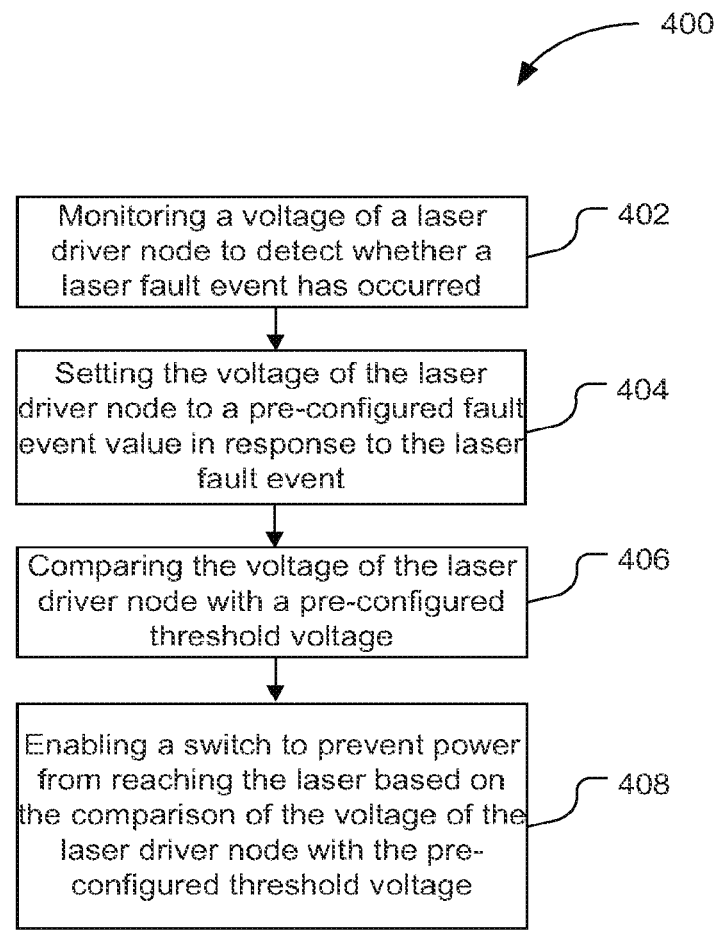
FIG. 4 is a flow diagram for a method of preventing laser transmission when a laser fault event occurs, in accordance with some embodiments.

FIG. 4 is a flow diagram for a method 400 of preventing laser transmission when a laser fault event occurs, in accordance with some embodiments. The method 400 may comport with techniques and configurations described in connection with FIGS. 1-3.

At 402, the method 400 may include monitoring a voltage of a laser driver node (e.g., laser driver cathode 226 of FIG. 2 or laser driver anode 322 of FIG. 3) to detect whether a laser fault event has occurred. The laser fault event may include, for example, electrical disconnection of a bonding wire that is configured to electrically couple the laser driver node with a laser (e.g., laser 220 or 320 of FIG. 2 or 3). The monitoring may be performed, for example, by a comparator (e.g., comparator 240 or 340 of FIG. 2 or 3) that is configured to compare the voltage of the laser driver node with a pre-configured threshold voltage (e.g., Vth of FIG. 2 or 3).

At 404, the method 400 may further include setting the voltage of the laser driver node to a pre-configured fault event value in response to the laser fault event. For example, a current source (e.g., Ibias current source 232 of FIG. 2 or Ibias+Imod current source 332 of FIG. 3) may be configured to set the voltage to the pre-configured fault event.

At 406, the method 400 may further include comparing the voltage of the laser driver node with a pre-configured threshold voltage. The comparing may be performed, for example, by the comparator.

At 408, the method 400 may further include enabling a switch (e.g., switch 248 of FIG. 2 or switch 348 of FIG. 3) to prevent power from reaching the laser based on the comparison of the voltage of the laser driver node with the pre-configured threshold voltage. In some embodiments, enabling the switch may be performed based on detecting that the laser fault event has occurred. The switch may be enabled to prevent a power supply voltage from reaching another laser driver node (e.g., laser driver anode 222 of FIG. 2 or laser driver cathode 326 of FIG. 3) in some embodiments. Enabling the switch may be performed, for example, by the comparator outputting a signal to enable the switch to power down the laser if the voltage of the laser driver node is set to the pre-configured fault event value. The signal may be output by the comparator to enable the switch to power down the laser based on the comparing of the voltage of the laser driver node with the pre-configured threshold value. Enabling the switch may be further performed by a gate coupled with the switch in response to the signal output by the comparator. Subsequent to enabling the switch at 408, the laser may be powered off.

Figure 5:
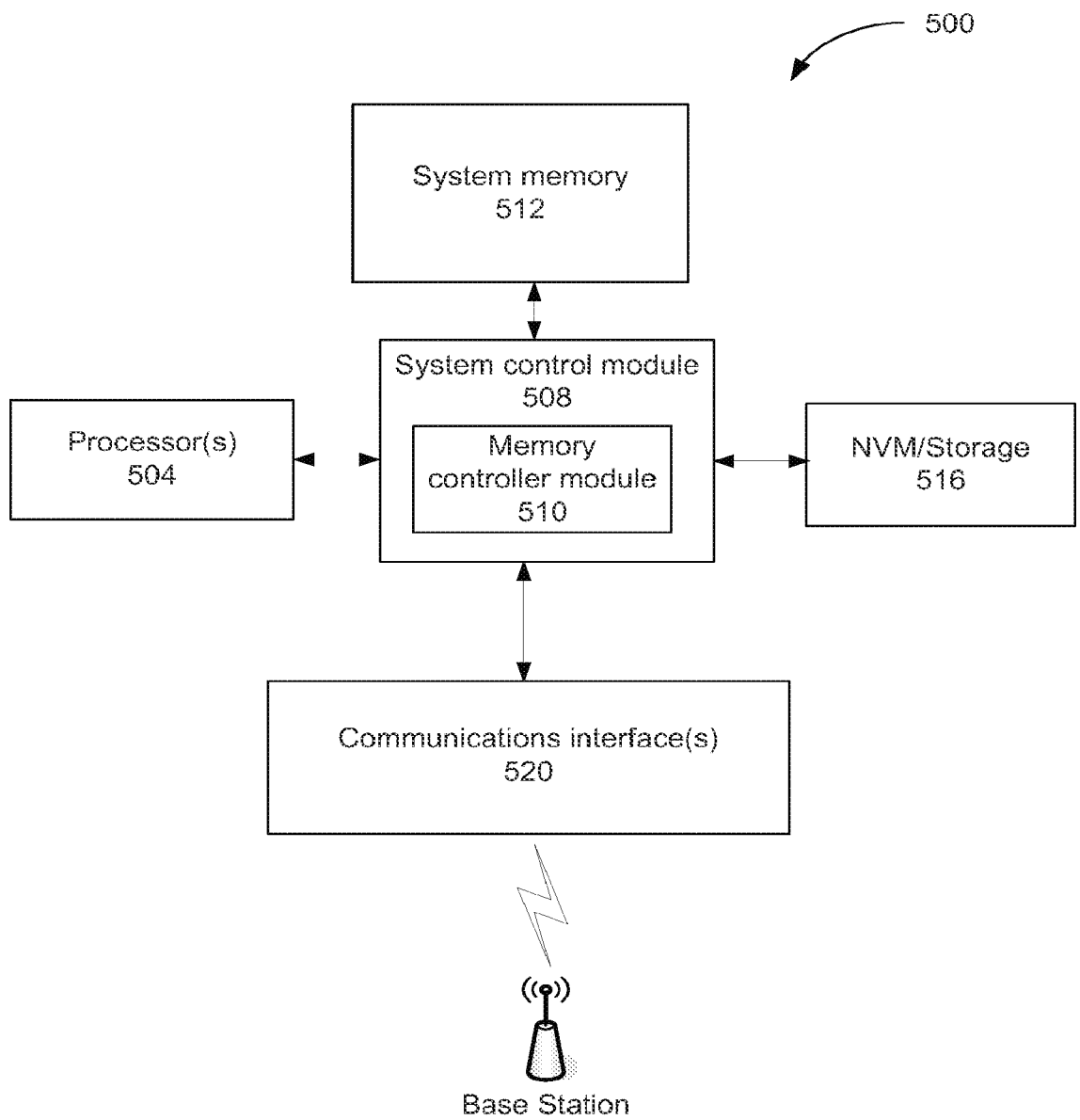
FIG. 5 schematically illustrates an example processor-based system that may be part of an optical communication system described herein, in accordance with some embodiments.

Embodiments of the present disclosure may be implemented into a system using any suitable hardware and/or software to configure as desired. FIG. 5 schematically illustrates an example processor-based system 500 that may be part of an optical communication system (e.g., optical communication system 100) described herein, in accordance with some embodiments. The example processor-based system 500 may represent, for example, the first processor-based system 125 or the second processor-based system 150 of FIG. 1 according to various embodiments. In one embodiment, the processor-based system 500 includes one or more processor(s) 504. One of the one or more processor(s) 504 may correspond, for example, with the processor 102 of FIG. 1.

The processor-based system 500 may further include system control module 508 coupled to at least one of the processor(s) 504, system memory 512 coupled to system control module 508, non-volatile memory (NVM)/storage 516 coupled to system control module 508, and one or more communications interface(s) 520 coupled to system control module 508.

System control module 508 for one embodiment may include any suitable interface controllers to provide for any suitable interface to at least one of the processor(s) 504 and/or to any suitable device or component in communication with system control module 508.

System control module 508 may include a memory controller module 510 to provide an interface to system memory 512. The memory controller module 510 may be a hardware module, a software module, and/or a firmware module.

System memory 512 may be used to load and store data and/or instructions, for example, for processor-based system 500. System memory 512 for one embodiment may include any suitable volatile memory, such as suitable Dynamic Random Access Memory (DRAM), for example.

System control module 508 for one embodiment may include one or more input/output (I/O) controller(s) to provide an interface to NVM/storage 516 and communications interface(s) 520.

The NVM/storage 516 may be used to store data and/or instructions, for example. NVM/storage 516 may include any suitable non-volatile memory, such as Phase Change Memory (PCM) or flash memory, for example, and/or may include any suitable non-volatile storage device(s), such as one or more hard disk drive(s) (HDD(s)), one or more compact disc (CD) drive(s), and/or one or more digital versatile disc (DVD) drive(s), for example.

The NVM/storage 516 may include a storage resource physically part of a device on which the processor-based system 500 is installed or it may be accessible by, but not necessarily a part of, the device. For example, the NVM/storage 516 may be accessed over a network via the communications interface(s) 520.

Communications interface(s) 520 may provide an interface for processor-based system 500 to communicate over one or more wired or wireless network(s) and/or with any other suitable device. For example, in some embodiments, the communication interface(s) 520 may be configured to communicate wirelessly over a wireless link established with a base station of a wireless communication network (e.g., radio access network (RAN) and/or core network). The communication interface(s) 520 may be configured with a transmitter, receiver, or transceiver to wirelessly transmit/receive signals according to various communication protocols including, for example, broadband wireless access (BWA) networks including networks operating in conformance with one or more protocols specified by the 3$^{rd}$ Generation Partnership Project (3GPP) and its derivatives, the WiMAX Forum, the Institute for Electrical and Electronic Engineers (IEEE) 802.16 standards (e.g., IEEE 802.16-2005 Amendment), long-term evolution (LTE) project along with any amendments, updates, and/or revisions (e.g., advanced LTE project, ultra mobile broadband (UMB) project (also referred to as "3GPP2"), etc.). The communication interface(s) 520 may be configured to communicate using additional/alternative communication standards, specifications, and/or protocols. For example, the communication interface(s) 520 may be configured to communicate with wireless local area networks (WLANs), wireless personal area networks (WPANs) and/or wireless wide area networks (WWANs) such as cellular networks (e.g., 2G, 3G, 4G, 5G, etc.) and the like. The communication interface(s) 520 may be configured to communicate according to technologies such as Evolution-Data Optimized (Ev- DO), Evolved High-Speed Packet Access (HSPA+), High-Speed Download Packet Access (HSDPA+), High-Speed Uplink Packet Access (HSUPA), Global System for Mobile communications (GSM), Enhanced Data GSM Environment (EDGE), General Packet Radio Service (GPRS), Code Division Multiple Access (CDMA), Time Division Multiple Access (TDMA), Digital Enhanced Cordless Telecommunications (DECT), Bluetooth, or derivatives thereof. The processor-based system 500 may include a plurality of communication chips (e.g., processor(s) 504). For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For one embodiment, at least one of the processor(s) 504 may be packaged together with logic for one or more controller(s) of system control module 508, e.g., memory controller module 510. For one embodiment, at least one of the processor(s) 504 may be packaged together with logic for one or more controllers of system control module 508 to form a System in Package (SiP). For one embodiment, at least one of the processor(s) 504 may be integrated on the same die with logic for one or more controller(s) of system control module 508.

For one embodiment, at least one of the processor(s) 504 may be integrated on the same die with logic for one or more controller(s) of system control module 508 to form a System on Chip (SoC).

In various embodiments, the processor-based system 500 may be, but is not limited to, a server, a workstation, a desktop computing device, or a mobile computing device (e.g., a laptop computing device, a handheld computing device, a handset, a tablet, a smartphone, a netbook, ultrabook, etc.). In various embodiments, the processor-based system 500 may have more or less components, and/or different architectures. For example, in some embodiments, the processor-based system 500 may include one or more of a camera, a keyboard, display such as a liquid crystal display (LCD) screen (including touch screen displays), a touchscreen controller, non-volatile memory port, antenna or multiple antennas, graphics chip, ASIC, speaker(s), a battery, an audio codec, a video codec, a power amplifier, a global positioning system (GPS) device, a compass, an accelerometer, a gyroscope, and the like. In various embodiments, the processor-based system 500 may have more or less components, and/or different architectures.

According to various embodiments, the present disclosure describes an optical module comprising a first die including a laser configured to transmit optical signals, a first node electrically coupled with the laser, and a second node electrically coupled with the laser, and a second die including a power supply line configured to provide power to the laser, a third node electrically coupled with the power supply line and electrically coupled with the first node to provide the power to the laser, a fourth node electrically coupled with the second node of the first die, and a switch configured to prevent the power of the power supply line from reaching the laser through the third node based on a voltage of the fourth node when a laser fault event occurs. In some embodiments, the first node is electrically coupled with the third node via a first bonding wire and the second node is electrically coupled with the fourth node via a second bonding wire. In some embodiments, the laser fault event occurs when the second bonding wire is electrically disconnected from the second node.

In some embodiments, the optical module further includes a current source configured to set the voltage of the fourth node to a pre-configured fault event value in response to the laser fault event. In some embodiments, the current source is a laser bias current source, the pre-configured fault event value is a ground voltage, the optical module further comprising a comparator configured to sense the voltage of the fourth node and output a signal based on the sensed voltage and a gate configured to control the switch based on the signal output from the comparator. In some embodiments, the optical module further includes a low-pass filter coupled with the fourth node and the comparator such that the voltage of the fourth node passes through the low-pass filter prior to being sensed by the comparator, a laser driver disposed on the second die, the laser driver being configured to drive the laser, wherein the gate, the comparator, and the laser bias current source are disposed on the second die. In some embodiments, the laser driver comprises a first transistor and a second transistor, the first transistor and the second transistor being configured as a differential pair to receive electrical signals for optical transmission by the laser.

In some embodiments, the optical module further includes a laser modulation current source coupled with the first transistor and the second transistor, wherein the first transistor is coupled with the power supply line, and the second transistor is coupled with the fourth node. In some embodiments, the first node and the third node are anodes and the second node and the fourth node are cathodes.

According to various embodiments, the present disclosure describes a power supply line configured to provide power to a laser, a first node electrically coupled with the power supply line and configured to provide the power to the laser, a second node configured to provide a laser bias current to the laser, and a switch configured to prevent the power of the power supply line from reaching the laser through the first node based on a voltage of the second node when a laser fault event occurs. In some embodiments, the first node is configured for wire-bonding with a third node of the laser via a first bonding wire and the second node is configured for wire-bonding with a second node of the laser via a second bonding wire. In some embodiments, the apparatus further includes a current source configured to set the voltage of the second node to a pre-configured value in response to the laser fault event. In some embodiments, the current source is a laser bias current source and the pre-configured fault event value is a ground voltage.

In some embodiments, the apparatus further includes a comparator configured to sense the voltage of the second node and output a signal based on the sensed voltage and a gate configured to control the switch based on the signal output from the comparator. In some embodiments, the apparatus further includes a laser driver configured to drive the laser. The laser driver may include a first transistor and a second transistor, the first transistor and the second transistor being configured as a differential pair to receive electrical signals for optical transmission by the laser, wherein the gate, the comparator, the current source, and the laser driver are disposed on a same die. In some embodiments, the apparatus may further include a laser modulation current source coupled with the first transistor and the second transistor, wherein the first transistor is coupled with the power supply line, and the second transistor is coupled with the second node.

According to various embodiments, the present disclosure describes a system comprising a processor, a communication interface coupled with the processor to communicatively couple the system to a wireless network and an optical module coupled with the processor to convert electrical signals received from the processor into optical signals, the optical module including a first die including a laser configured to transmit the optical signals, a first node electrically coupled with the laser, and a second node electrically coupled with the laser and a second die including a power supply line configured to provide power to the laser, a third node electrically coupled with the power supply line and electrically coupled with the first node to provide the power to the laser, a fourth node electrically coupled with the second node of the first die, and a switch configured to prevent the power of the power supply line from reaching the laser through the third node based on a voltage of the fourth node when a laser fault event occurs. In some embodiments, the first node is electrically coupled with the third node via a first bonding wire and the second node is electrically coupled with the fourth node via a second bonding wire. In some embodiments, the laser fault event occurs when the second bonding wire is electrically disconnected with the second node.

In some embodiments, the system further includes a current source configured to set the voltage of the fourth node to a pre-configured value in response to the laser fault event. In some embodiments, the current source is a laser bias current source, the pre-configured fault event value is a ground voltage. In some embodiments, the system further includes a comparator configured to sense the voltage of the fourth node and output a signal based on the sensed voltage and a gate configured to control the switch based on the signal output from the comparator. In some embodiments, the system further includes a laser driver disposed on the second die, the laser driver being configured to drive the laser, wherein the gate, the comparator, and the current source are disposed on the second die. In some embodiments, the first node and the third node are anodes and the second node and the fourth node are cathodes. In some embodiments, the system includes a touchscreen display and the system is a mobile computing device.

According to various embodiments, the present disclosure describes a method comprising monitoring a voltage of a first node of a laser driver to detect whether a laser fault event has occurred, the first node being electrically coupled with a laser and enabling a switch to prevent power of a power supply line from reaching a second node of the laser driver that is electrically coupled with the power supply line based on detecting that the laser fault event has occurred. In some embodiments, the laser fault event includes electrical disconnection of a bonding wire that is configured to electrically couple the first node with the laser.

In some embodiments, the method further includes setting, by a current source, the voltage of the first node to a pre-configured fault event value in response to the laser fault event. In some embodiments, monitoring the voltage of the laser driver comprises comparing, by a comparator, the voltage of the first node with a pre-configured threshold voltage.

In some embodiments, the method further includes outputting, by the comparator, a signal to enable the switch to prevent the power of the power supply line from reaching the second node if the voltage of the first node is set to the pre-configured fault event value, the outputting being based on the comparing of the voltage of the first node with the pre-configured threshold value. In some embodiments, the method further includes enabling, by a gate coupled with the switch, the switch in response to the signal output by the comparator. In some embodiments, the power supply line has a voltage of 3.1 volts (V) to 3.4 V, the pre-configured fault event value is a ground voltage, the pre-configured threshold value has a voltage of 0.5 V to 0.7 V and a voltage of the second node prior to occurrence of the laser fault event is 1.1 V to 1.3 V.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An optical module comprising:
a first die including:
    a laser configured to transmit optical signals,
    a first node electrically coupled with the laser, and
    a second node electrically coupled with the laser; and
a second die including:
    a power supply line configured to provide power to the laser,
    a third node electrically coupled with the power supply line and electrically coupled with the first node to provide the power to the laser,
    a fourth node electrically coupled with the second node of the first die, and
    a switch configured to prevent the power of the power supply line from reaching the laser through the third node based on a voltage of the fourth node when a laser fault event occurs.

2. The optical module of claim 1, wherein:
the first node is electrically coupled with the third node via a first bonding wire; and
the second node is electrically coupled with the fourth node via a second bonding wire.

3. The optical module of claim 2, wherein the laser fault event occurs when the second bonding wire is electrically disconnected from the second node.

4. The optical module of claim 1, further comprising:
a current source configured to set the voltage of the fourth node to a pre-configured fault event value in response to the laser fault event wherein the current source is a laser bias current source, the pre-configured fault event value is a ground voltage, the optical module further comprising:
a comparator configured to sense the voltage of the fourth node and output a signal based on the sensed voltage; and
a gate configured to control the switch based on the signal output from the comparator.

5. The optical module of claim 4, further comprising:
a low-pass filter coupled with the fourth node and the comparator such that the voltage of the fourth node passes through the low-pass filter prior to being sensed by the comparator; and
a laser driver disposed on the second die, the laser driver being configured to drive the laser, wherein the gate, the comparator, and the laser bias current source are disposed on the second die, wherein the laser driver comprises:
a first transistor; and
a second transistor, the first transistor and the second transistor being configured as a differential pair to receive electrical signals for optical transmission by the laser.

6. The optical module of claim 5, further comprising:
a laser modulation current source coupled with the first transistor and the second transistor, wherein the first transistor is coupled with the power supply line, and the second transistor is coupled with the fourth node.

7. The optical module of claim 1, wherein:
the first node and the third node are anodes; and
the second node and the fourth node are cathodes.

8. An apparatus comprising:
a power supply line configured to provide power to a laser;
a first node electrically coupled with the power supply line and configured to provide the power to the laser;
a second node configured to provide a laser bias current to the laser; and
a switch configured to prevent the power of the power supply line from reaching the laser through the first node based on a voltage of the second node when a laser fault event occurs.

9. The apparatus of claim 8, wherein:
the first node is configured for wire-bonding with a third node of the laser via a first bonding wire; and
the second node is configured for wire-bonding with a second node of the laser via a second bonding wire.

10. The apparatus of claim 8, further comprising:
a current source configured to set the voltage of the second node to a pre-configured value in response to the laser fault event, wherein the current source is a laser bias current source, the pre-configured fault event value is a ground voltage, the apparatus further comprising:
a comparator configured to sense the voltage of the second node and output a signal based on the sensed voltage; and
a gate configured to control the switch based on the signal output from the comparator.

11. The apparatus of claim 10, further comprising:
a laser driver configured to drive the laser, the laser driver including:
a first transistor; and
a second transistor, the first transistor and the second transistor being configured as a differential pair to receive electrical signals for optical transmission by the laser, wherein the gate, the comparator, the current source, and the laser driver are disposed on a same die; and
a laser modulation current source coupled with the first transistor and the second transistor, wherein the first transistor is coupled with the power supply line, and the second transistor is coupled with the second node.

12. A system comprising:
a processor;
a communication interface coupled with the processor to communicatively couple the system to a wireless network; and
an optical module coupled with the processor to convert electrical signals received from the processor into optical signals, the optical module including:
a first die including:
a laser configured to transmit the optical signals,
a first node electrically coupled with the laser, and
a second node electrically coupled with the laser; and
a second die including:
a power supply line configured to provide power to the laser,
a third node electrically coupled with the power supply line and electrically coupled with the first node to provide the power to the laser,
a fourth node electrically coupled with the second node of the first die, and
a switch configured to prevent the power of the power supply line from reaching the laser through the third node based on a voltage of the fourth node when a laser fault event occurs.

13. The system of claim 12, wherein:
the first node is electrically coupled with the third node via a first bonding wire; and
the second node is electrically coupled with the fourth node via a second bonding wire.

14. The system of claim 13, wherein the laser fault event occurs when the second bonding wire is electrically disconnected with the second node.

15. The system of claim 12, further comprising:
a current source configured to set the voltage of the fourth node to a pre-configured value in response to the laser fault event.

16. The system of claim 15, wherein the current source is a laser bias current source, the pre-configured fault event value is a ground voltage, the system further comprising:
a comparator configured to sense the voltage of the fourth node and output a signal based on the sensed voltage;
a gate configured to control the switch based on the signal output from the comparator; and
a laser driver disposed on the second die, the laser driver being configured to drive the laser, wherein the gate, the comparator, and the current source are disposed on the second die.

17. The system of claim 12, wherein:
the first node and the third node are anodes; and
the second node and the fourth node are cathodes.

18. The system of claim 12, wherein:
the system includes a touchscreen display; and
the system is a mobile computing device.

19. A method comprising:
monitoring a voltage of a first node of a laser driver to detect whether a laser fault event has occurred, the first node being electrically coupled with a laser; and
enabling a switch to prevent power of a power supply line from reaching a second node of the laser driver that is electrically coupled with the power supply line based on detecting that the laser fault event has occurred.

20. The method of claim 19, wherein the laser fault event includes electrical disconnection of a bonding wire that is configured to electrically couple the first node with the laser.

21. The method of claim 19, further comprising:
setting, by a current source, the voltage of the first node to a pre-configured fault event value in response to the laser fault event.

22. The method of claim 21, wherein monitoring the voltage of the laser driver comprises:
comparing, by a comparator, the voltage of the first node with a pre-configured threshold voltage.

23. The method of claim 22, further comprising:
outputting, by the comparator, a signal to enable the switch to prevent the power of the power supply line from reaching the second node if the voltage of the first node is set to the pre-configured fault event value, the outputting being based on the comparing of the voltage of the first node with the pre-configured threshold value.

24. The method of claim 23, further comprising:
enabling, by a gate coupled with the switch, the switch in response to the signal output by the comparator.

25. The method of claim 22, wherein:
the power supply line has a voltage of 3.1 volts (V) to 3.4 V;
the pre-configured fault event value is a ground voltage;
the pre-configured threshold value has a voltage of 0.5 V to 0.7 V; and
a voltage of the second node prior to occurrence of the laser fault event is 1.1 V to 1.3 V.

* * * * *